United States Patent
Graf et al.

(10) Patent No.: US 7,217,610 B2
(45) Date of Patent: May 15, 2007

(54) METHOD FOR FABRICATING A SEMICONDUCTOR PRODUCT WITH A MEMORY AREA AND A LOGIC AREA

(75) Inventors: Werner Graf, Dresden (DE); Albrecht Kieslich, Radebeul (DE)

(73) Assignee: Infineon Technologies AG, München (DE)

( * ) Notice: Subject to any disclaimer, the term of this patent is extended or adjusted under 35 U.S.C. 154(b) by 223 days.

(21) Appl. No.: 10/485,308

(22) PCT Filed: Jul. 30, 2002

(86) PCT No.: PCT/EP02/08484

§ 371 (c)(1),
(2), (4) Date: Aug. 3, 2004

(87) PCT Pub. No.: WO03/015161

PCT Pub. Date: Feb. 20, 2003

(65) Prior Publication Data

US 2004/0259298 A1    Dec. 23, 2004

(30) Foreign Application Priority Data

Aug. 1, 2001  (DE) ................................ 101 37 678

(51) Int. Cl.
*H01L 21/8238* (2006.01)
*H01L 27/108* (2006.01)

(52) U.S. Cl. ................ 438/210; 438/241; 257/296; 257/E21.66

(58) Field of Classification Search ............. 438/210
See application file for complete search history.

(56) References Cited

U.S. PATENT DOCUMENTS

| | | | |
|---|---|---|---|
| 5,668,035 A | 9/1997 | Fang | |
| 5,882,965 A | 3/1999 | Schwalke | |
| 6,020,610 A * | 2/2000 | Ueno et al. | 257/315 |
| 6,037,222 A * | 3/2000 | Huang et al. | 438/257 |
| 6,087,225 A | 7/2000 | Bronner | |
| 6,107,154 A | 8/2000 | Lin | |
| 6,130,449 A | 10/2000 | Matsuoka | |
| 6,133,130 A | 10/2000 | Lin | |
| 6,153,459 A | 11/2000 | Sun | |
| 6,208,004 B1 | 3/2001 | Cunningham | |

FOREIGN PATENT DOCUMENTS

| | | |
|---|---|---|
| DE | 42 39 142 A1 | 6/1993 |
| EP | 1 039 533 A2 | 9/2000 |
| EP | 1 039 533 A3 | 4/2001 |
| KR | 19990072249 A | 9/1999 |
| KR | 20010006849 A | 1/2001 |
| WO | WO 01/47012 A1 | 6/2001 |

* cited by examiner

*Primary Examiner*—Chandra Chaudhari
(74) *Attorney, Agent, or Firm*—Morrison & Foerster LLP

(57) ABSTRACT

A method for the integration of field-effect transistors for memory and logic applications in a semiconductor substrate is disclosed. The gate dielectric and a semiconductor layer are deposited over the whole area both in the logic region and in the memory region. From these layers, the gate electrodes in the memory region are formed, the source and drain regions are implanted and the memory region is covered in a planarizing manner with an insulation material. Afterward, the gate electrodes are formed from the semiconductor layer and the gate dielectric in the logic region.

16 Claims, 23 Drawing Sheets

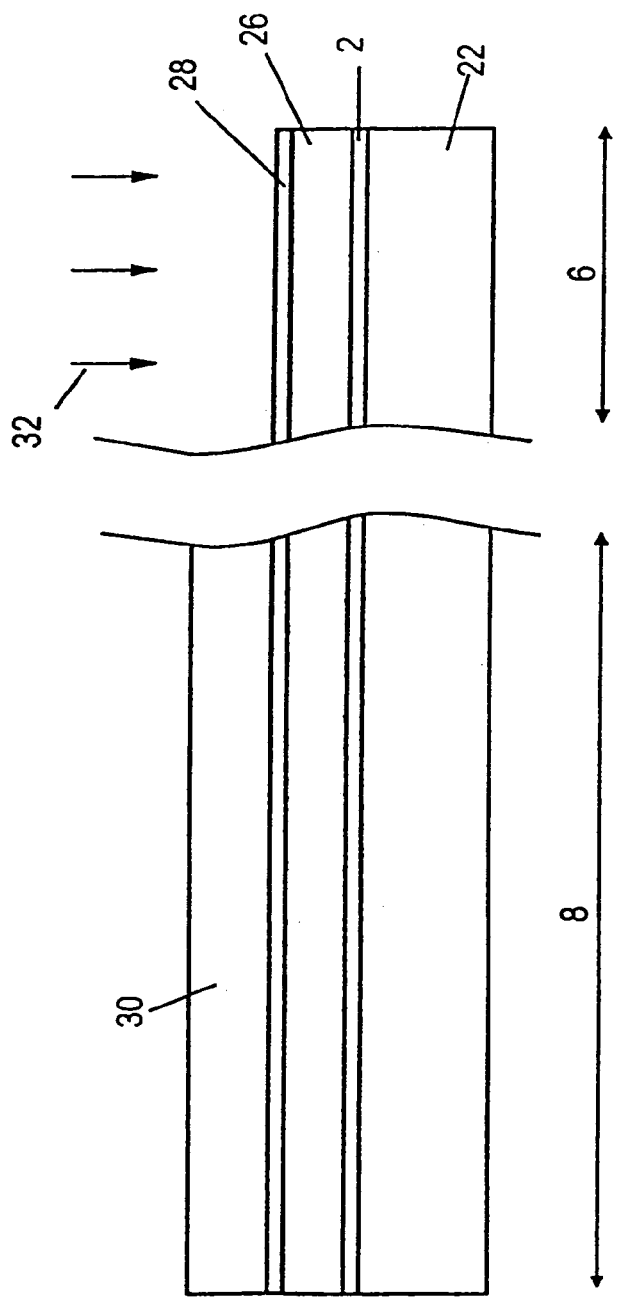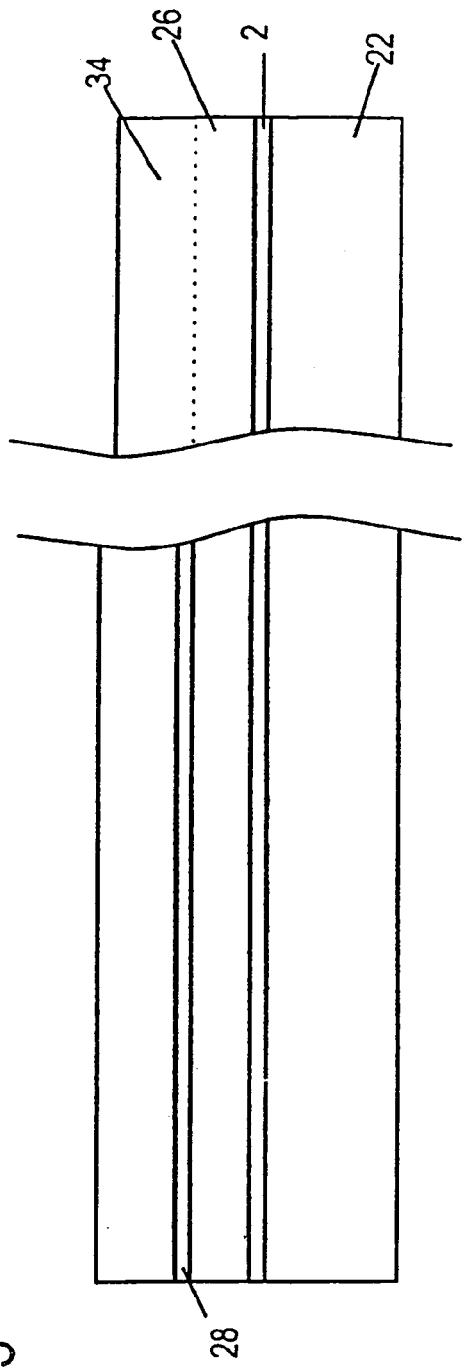

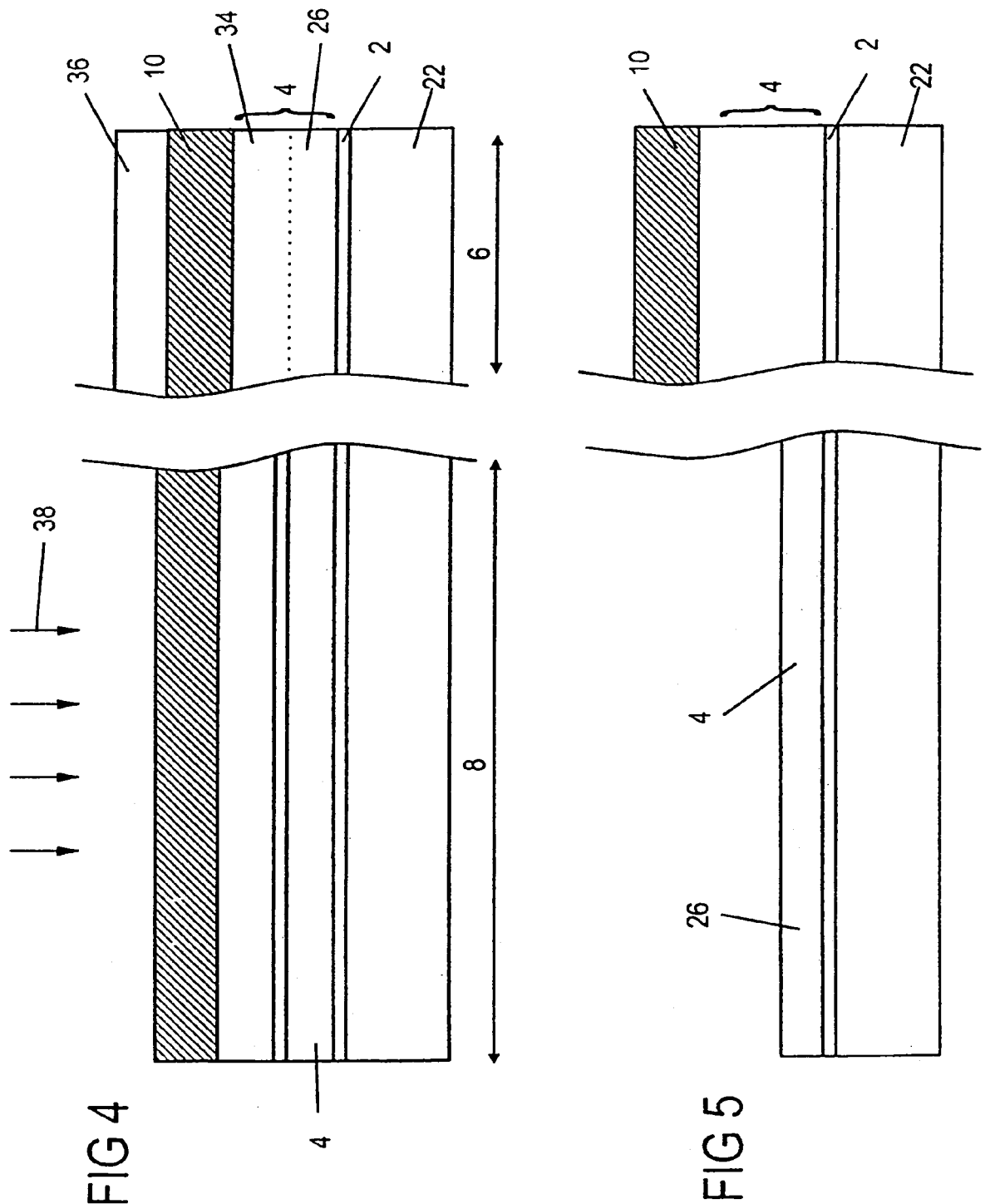

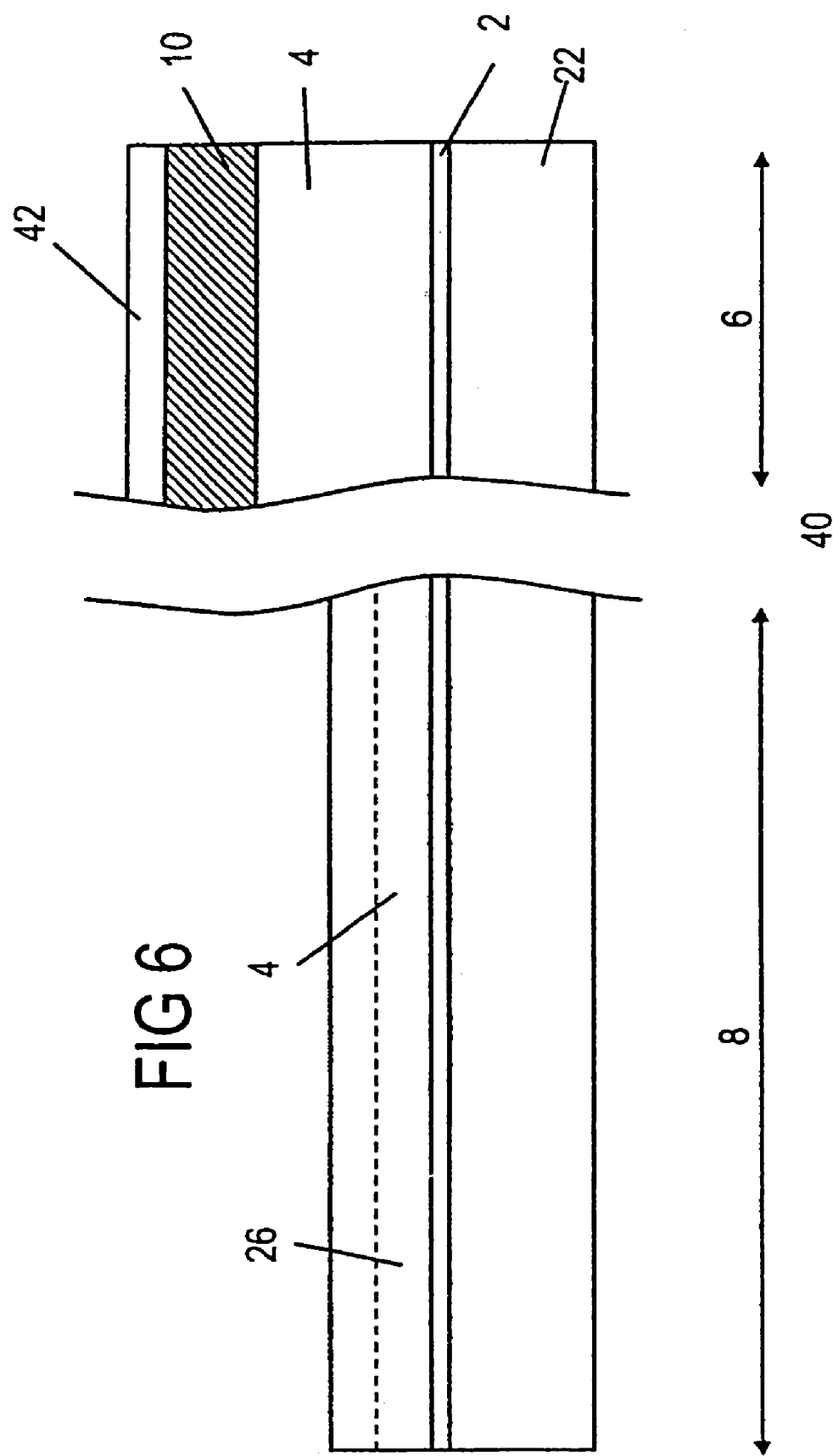

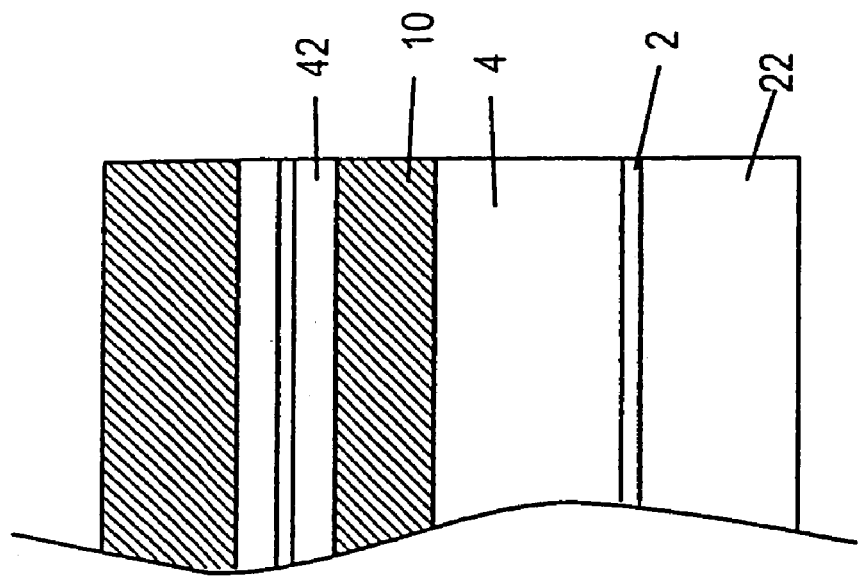
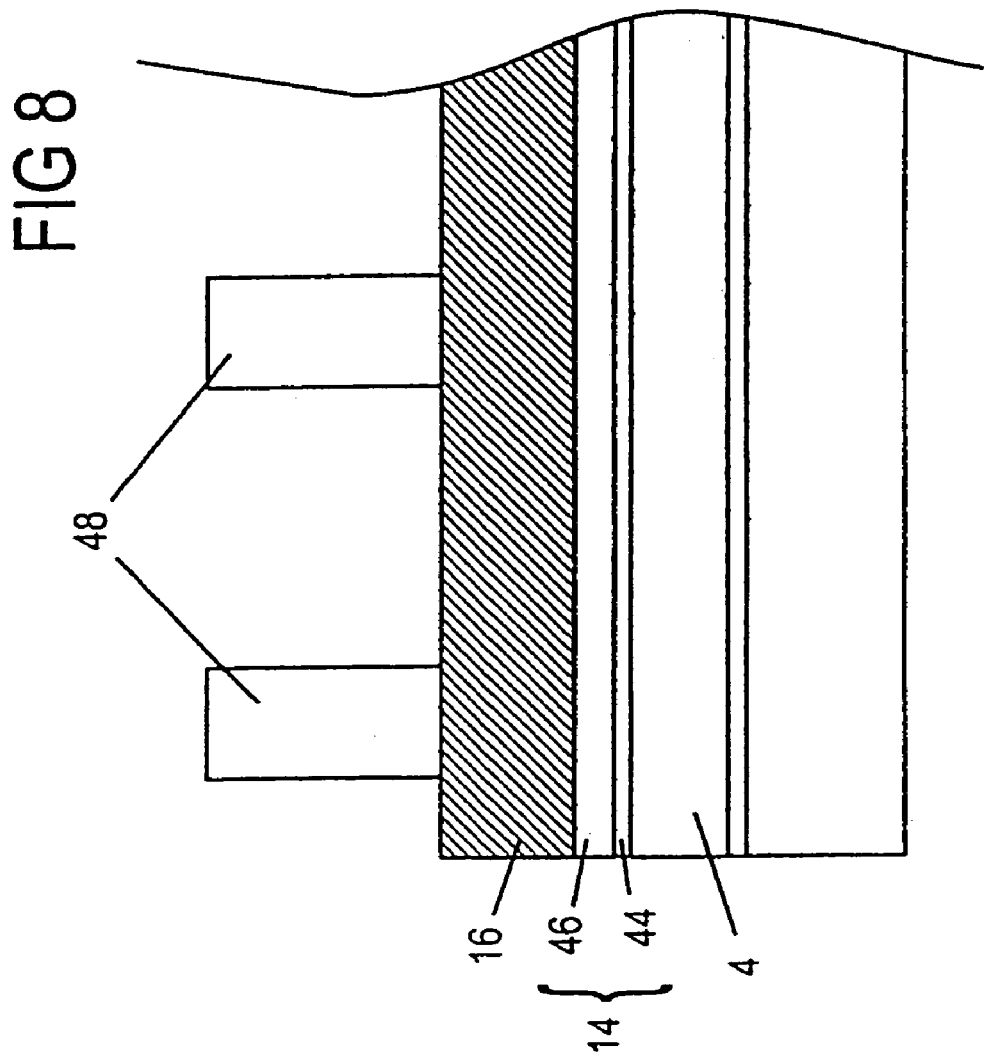

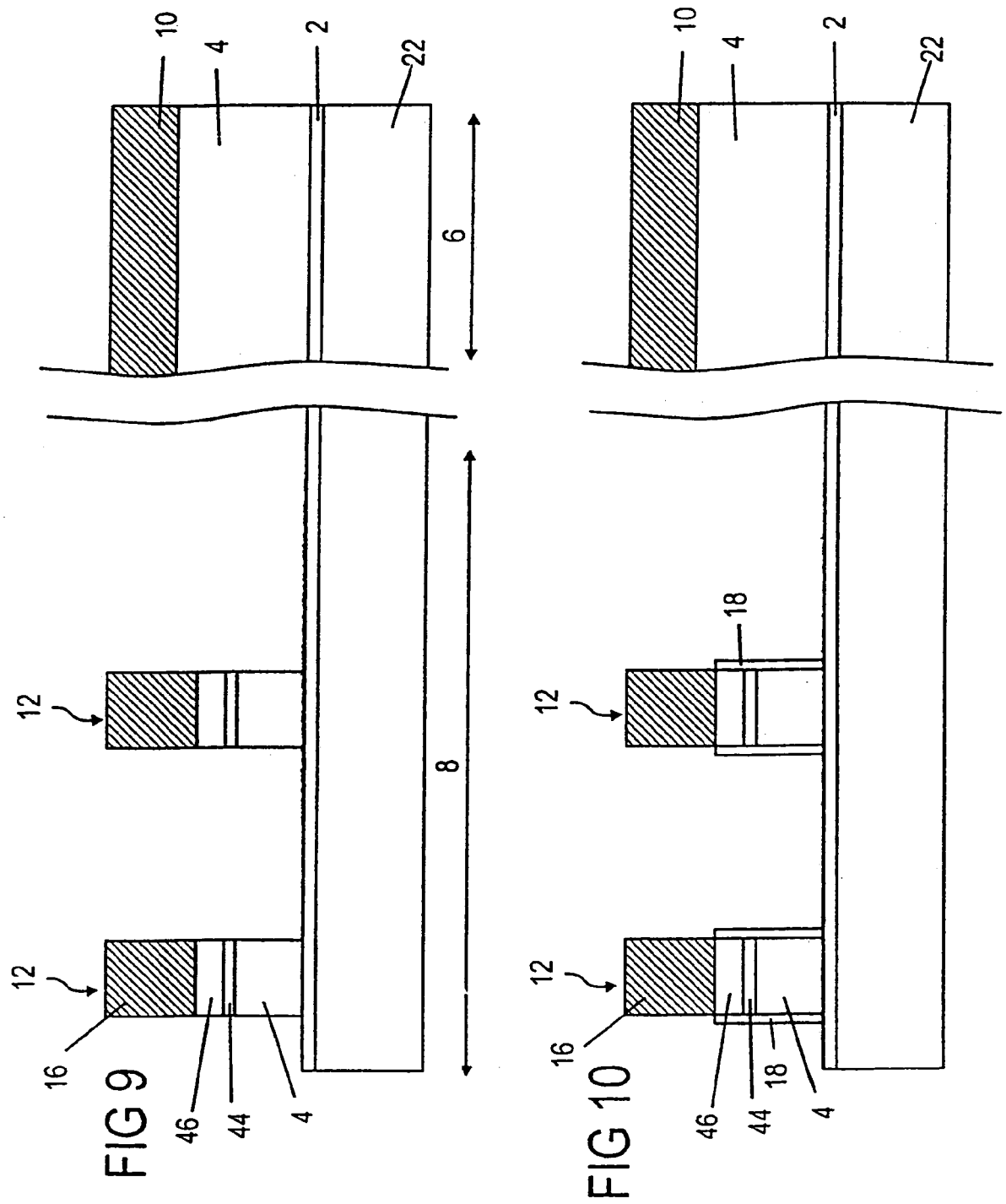

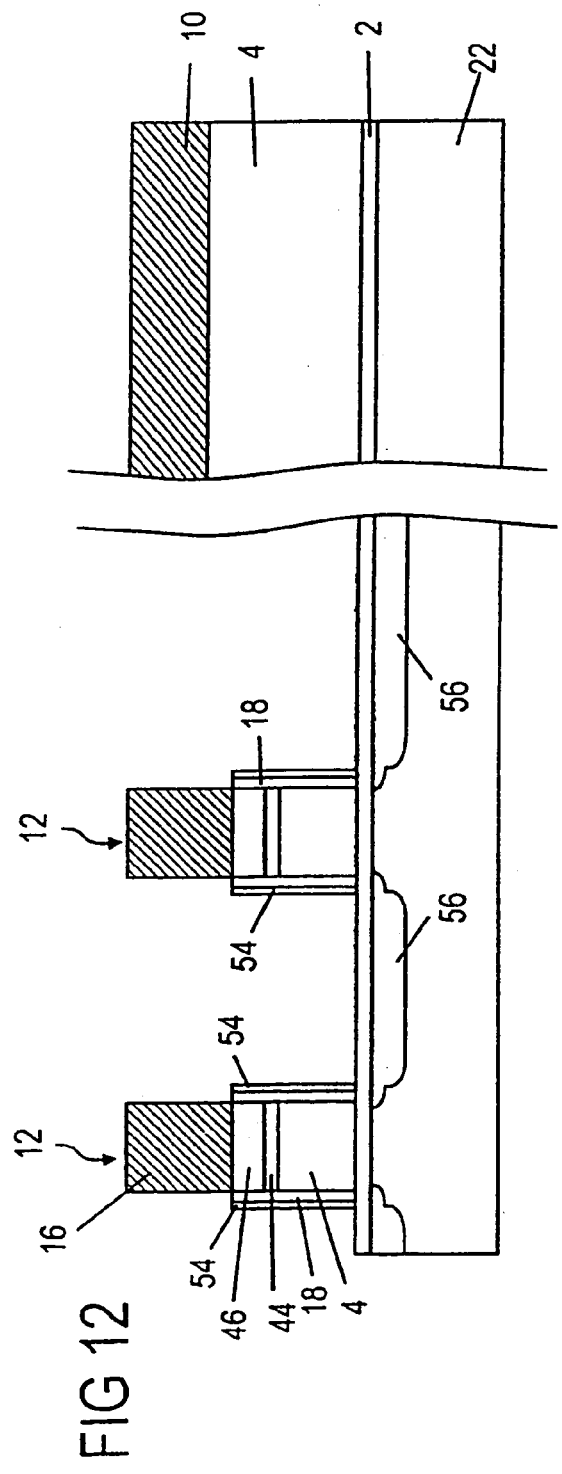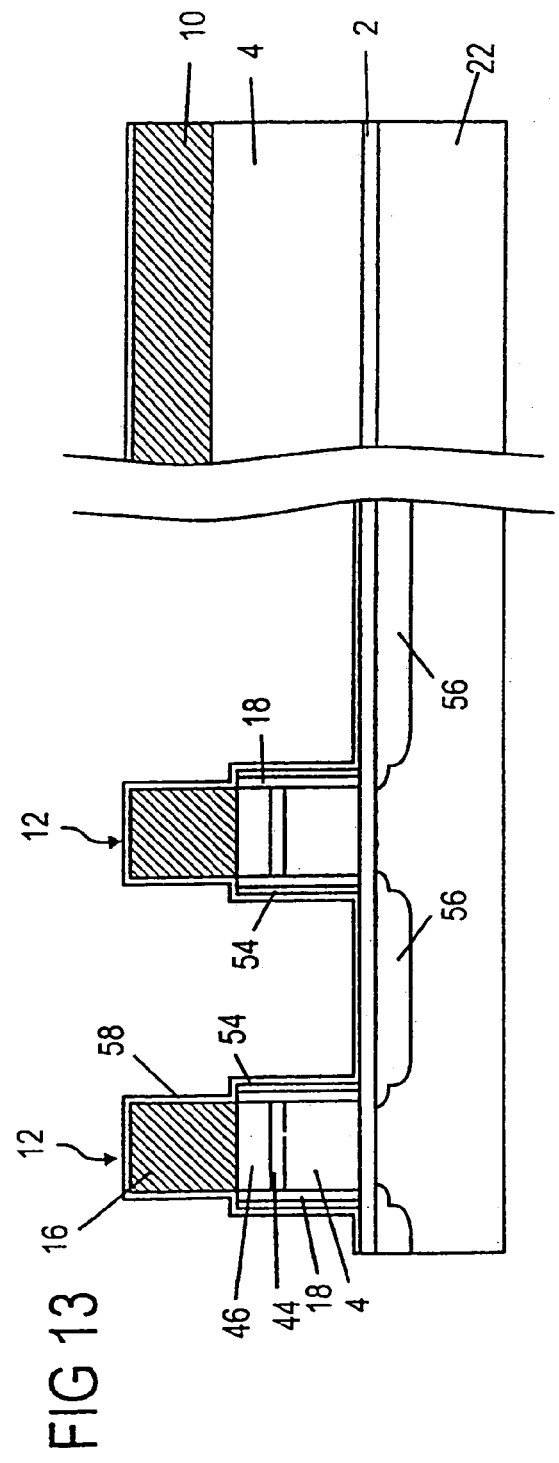

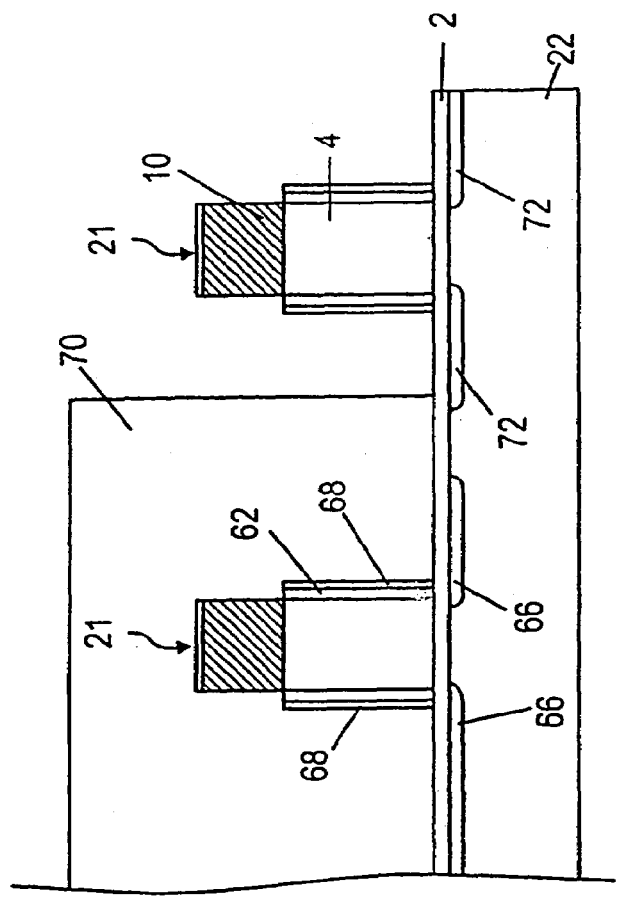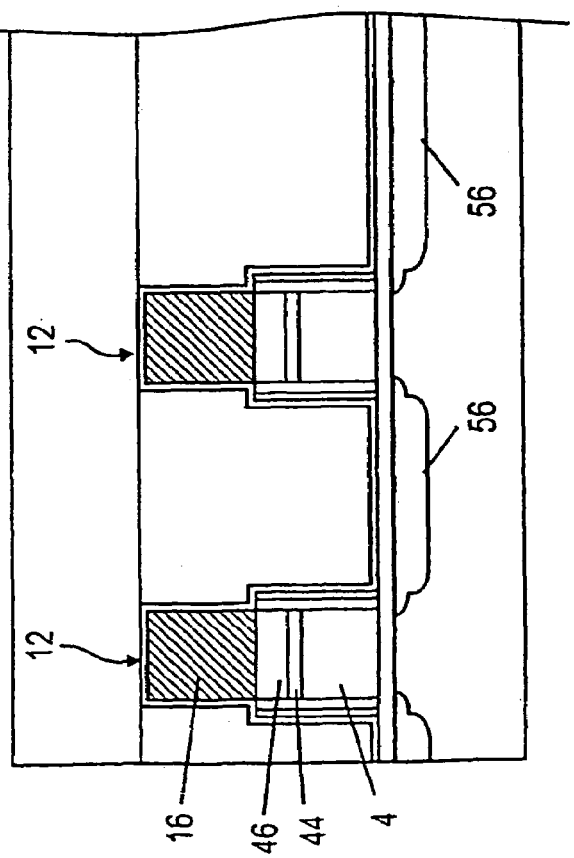
FIG 20

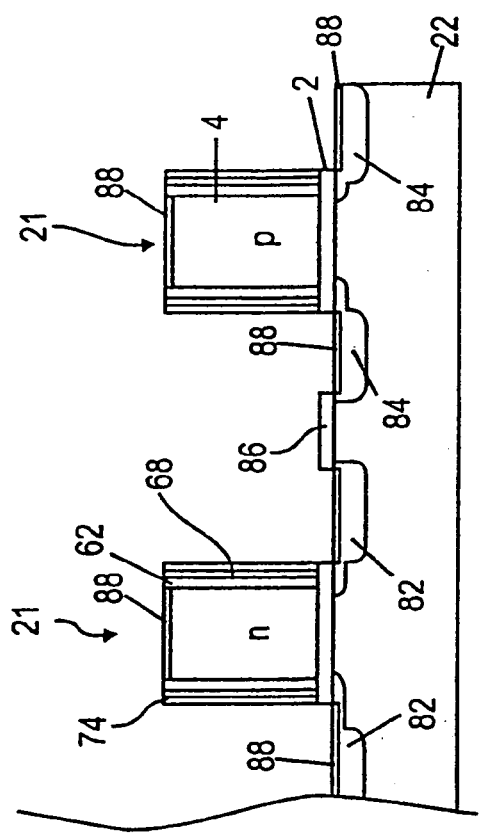
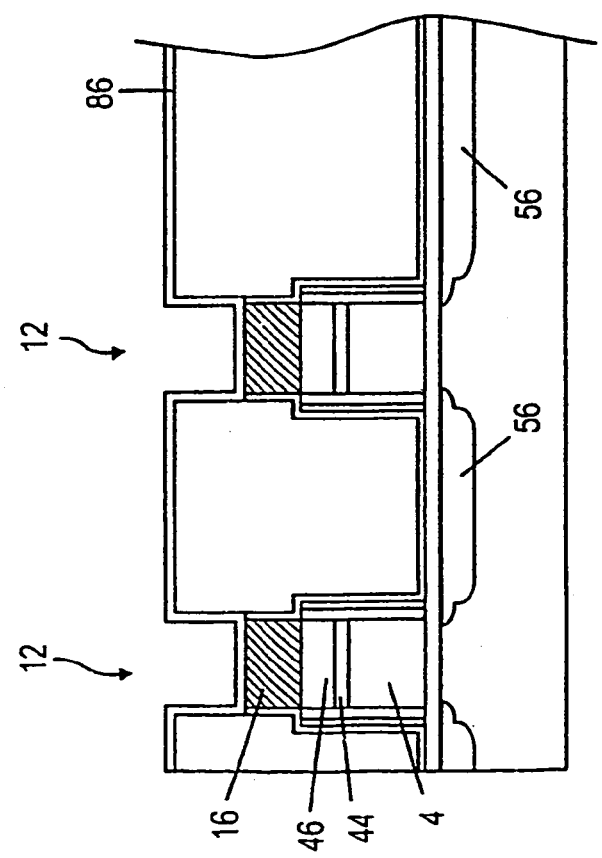
FIG 26

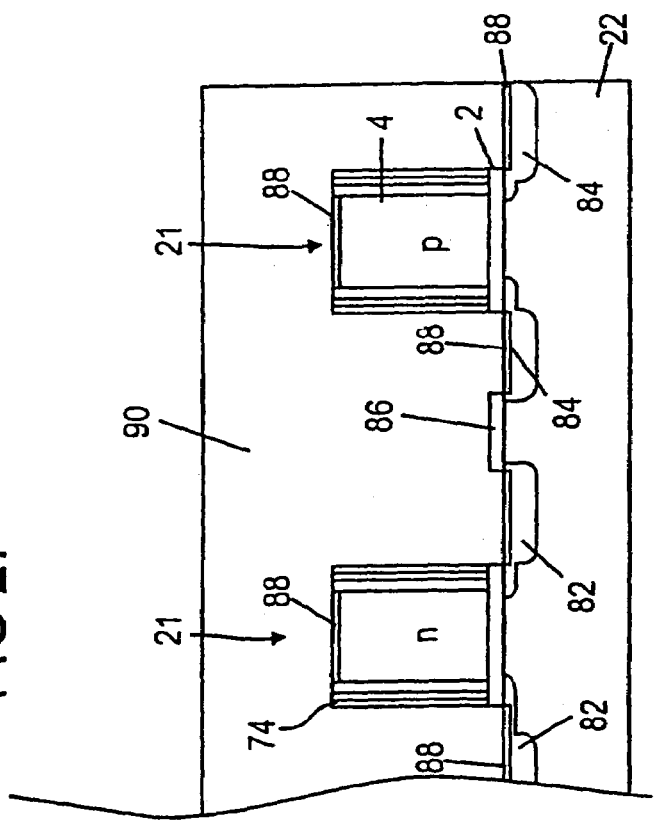
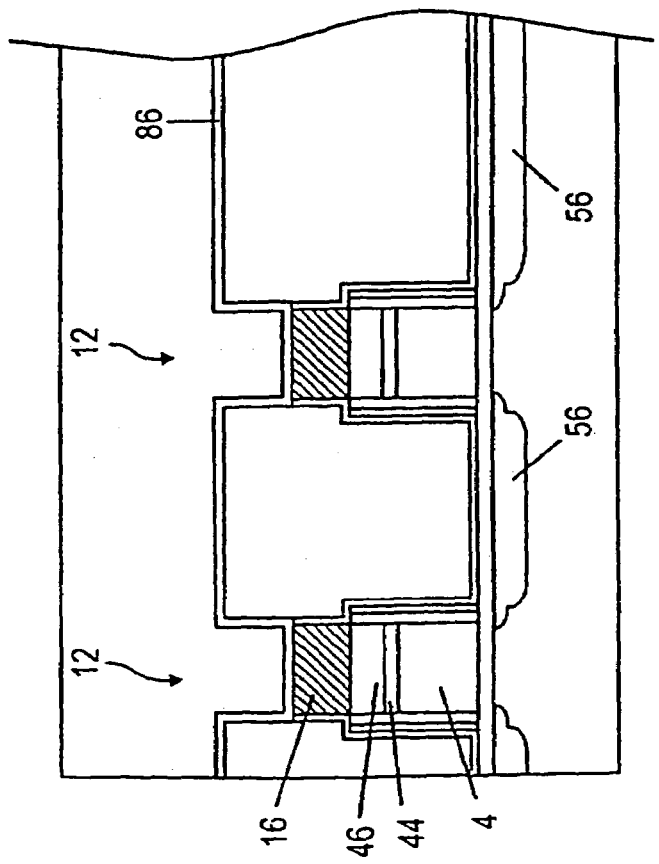
FIG 27

METHOD FOR FABRICATING A SEMICONDUCTOR PRODUCT WITH A MEMORY AREA AND A LOGIC AREA

CLAIM FOR PRIORITY

This application claims priority to International Application No. PCT/EP02/08484, published in the German langague on Feb. 20, 2003, which claims the benefit of priority to German Application No. DE 101 37 678.2, filed in the German language on Aug. 1, 2001.

TECHNICAL FIELD OF THE INVENTION

The invention relates to semiconductor technology, and and in particular to a method for fabricating a semiconductor product with a memory region and a logic region, and to a semiconductor product.

BACKGROUND OF THE INVENTION

Semiconductor products are being fabricated with integrated memory and logic regions to an increasing extent. However, this makes particularly stringent requirements of the fabrication process, since different requirements are made of the field-effect transistors (FE transistors) in the memory and logic regions. Thus, by way of example, the FE transistors in the memory region, which generally serve there as selection transistors for assigned memory cells, must have a particularly low leakage current. By contrast, in the case of FE transistors in the logic region, particular importance is attached to a high switching speed and a low threshold voltage. In order to meet these different requirements, different, specially adapted fabrication methods have been developed for FE transistors for logic and memory applications.

One difference in fabrication resides e.g. in the fact that logic applications require complementary FE transistors, so-called CMOS transistors, in which, depending on the p- or n-channel, the gate material is also doped differently. In memory applications, only one gate material with one doping is generally used. The consequence of this is that only one channel, typically the n-channel, can be realized as surface channel, while the other channel, typically the p-channel, is realized as a so-called "buried channel". In the course of further miniaturization, the "buried channel" has proved to have limited performance, so that nowadays, for this reason inter alia, in a logic process n- and p-type transistors are used as surface transistors and a higher performance can be obtained in this case. N-and p-channel transistors with a differently doped gate electrode or with gate materials with a different work function for electrons are also referred to as "dual work function devices" or "dual-gate devices", generally the gate electrode of the n-channel transistor being n-doped and the gate electrode of the p-channel transistor being p-doped. The term dual work function is used hereinafter. A fabrication method suitable for fabricating transistors of this type is described for example in U.S. Pat. No. 5,882,965.

In order to set the different threshold voltages in logic and memory transistors, the gate dielectrics of the transistors are often formed with different thicknesses. A method in this respect is disclosed e.g. in U.S. Pat. No. 5,668,035, in which firstly a thick gate dielectric and a polysilicon layer are deposited on a silicon substrate both in the logic region and in the memory region and then both layers are removed from the logic region, where a comparatively thin gate dielectric is formed and a polysilicon layer is deposited. What is thereby achieved is that a thinner gate dielectric compared with the memory region is present in the logic region. The gate stack and also the source and drain regions are subsequently formed together both in the logic region and in the memory region.

By contrast, the formation of FE transistors for memory applications and dual work function transistors for logic applications on a common semiconductor substrate is described in U.S. Pat. No. 6,107,154, U.S. Pat. No. 6,153, 459 and U.S. Pat. No. 6,087,225.

In the case of the method according to U.S. Pat. No. 6,107,154, firstly a gate oxide and a polysilicon layer are deposited onto a semiconductor substrate and subsequently patterned. In this case, gate electrodes of FE transistors are produced both in the logic region and in the memory region. This is followed by the simultaneous formation of source and drain regions in both regions. What is disadvantageous here is that the simultaneous fabrication of the FE transistors in both regions means that it is not possible to deal with the specific requirements of the FE transistors provided for logic and memory applications.

By contrast, U.S. Pat. No. 6,153,459 discloses patterning the gate oxide, deposited over the whole area of the semiconductor substrate, and the polysilicon layer, likewise deposited over the whole area, only in the memory region, whilst completely removing them in the logic region. Afterward, in the logic region, a gate oxide is formed and a polysilicon layer is deposited, said polysilicon layer being patterned only in the logic region with the formation of gate electrodes, whilst being completely removed in the memory region. The gate electrodes in the logic region are then n- or p-doped. Finally, the source and drain regions are formed in both regions.

By contrast, U.S. Pat. No. 6,087,225 describes the formation of a gate oxide and a first polysilicon layer in the memory region, formation of a gate oxide in the logic region and whole-area deposition of a second polysilicon layer with subsequent patterning, during which gate electrodes are formed in the logic region and the second polysilicon layer is removed in the memory region, and subsequent patterning of the first polysilicon layer for the formation of gate electrodes in the memory region. This is followed by the fabrication of source and drain regions both in the memory region and in the logic region.

What is disadvantageous about the previously known methods is that the method steps for fabricating the FE transistors in the memory or logic region have effects on the respective other region.

SUMMARY OF THE INVENTION

The present invention discloses a method for fabricating a semiconductor product in which the effects are largely precluded.

In one embodiment of the invention, there is a method for fabricating a semiconductor product which has a semiconductor substrate with at least one memory region and a logic region, having:

a) a dielectric layer (e.g. thick or thin oxide) serving as gate dielectric and a semiconductor layer are applied to a surface of the semiconductor substrate both in the memory region and in the logic region;

b) the semiconductor layer is firstly patterned in the memory region with the formation of gate electrodes;

c) in the memory region, adjacent to the gate electrodes formed there, dopants for forming source and drain regions are introduced into the semiconductor substrate;
d) the interspaces between the gate electrodes in the memory region are largely completely filled with an insulation material; and
e) in subsequent steps, in the logic region, the semiconductor layer is patterned with the formation of gate electrodes and the gate electrodes formed there are doped, one portion of these gate electrodes being n-doped and the other portion being p-doped.

Accordingly, according to one embodiment of the invention, the gate electrodes and the gate oxide in both regions emerge from in each case a layer produced or deposited over the whole area. The gate oxides therefore have the same thickness in both regions. Furthermore, from the semiconductor layer deposited over the whole area, firstly the gate electrodes are formed in the memory region and there the associated source and drain regions are produced and the interspaces between the gate electrodes in the memory region are filled with an insulation material. The FE transistors and the required intermediate insulation are thus completely fabricated in the memory region. In particular, the intermediate insulation formed by the insulation material is applied at high temperatures or subjected to thermal aftertreatment in order that the relatively small interspaces can be readily filled. In order to protect the semiconductor layer in the logic region from the processes carried out in the cell region, e.g. during an implantation, an insulating layer may therefore preferably be applied to the semiconductor layer in the logic region before the formation of the gate electrodes in accordance with step b). For a multiplicity of process steps, however, a thin liner layer also suffices, which can be deposited over the whole area e.g. after step c) and before step d). The insulating layer and the liner layer are preferably composed of silicon nitride.

According to one embodiment of the invention, the FE transistors in the memory region are completely formed before the fabrication of the FE transistors in the logic region. Therefore, reciprocal influencing of the method steps for fabricating the FE transistors in the memory and logic regions is largely avoided.

Preferably, the semiconductor layer is deposited as an undoped polycrystalline semiconductor layer and is firstly doped in the memory region before the formation of the gate electrodes. This is preferably done by applying a doped semiconductor layer. A likewise suitable alternative for doping the semiconductor layer is an implantation, in which case, in the logic region, the insulating layer may serve as a layer affording protection from the implantation. By means of suitable thermal treatment, the dopants can defuse from the doped semiconductor layer into the undoped semiconductor layer. This results in a highly uniform doping of both layers.

In one advantageous embodiment of the invention, the semiconductor layer comprises a first and a second partial layer, which covers the first partial layer either in the logic region or in the memory region, with the result that the semiconductor layer is material-reinforced in one of the two regions by the application of the second partial layer to the first partial layer. Preferably, the second partial layer is applied in the logic region, with the result that the semiconductor layer is thicker in the logic region than in the memory region. The semiconductor layer formed with a varying thickness enables more targeted adaptation of the transistor properties in the logic and memory regions to the respectively desired requirements.

The application in two partial layers for the formation of semiconductor layers of varying thickness in the two regions furthermore has the advantage that the dielectric layer serving as gate dielectric remains completely covered by the first partial layer during the entire fabrication process and is thus protected.

Preferably, the formation of the semiconductor layer from two partial layers is effected as follows:
an etching stop layer is applied to the first partial layer deposited over the whole area, which etching stop layer covers the first partial layer in the logic region or in the memory region;
further semiconductor material for the formation of the second partial layer is applied over the whole area of the etching stop layer and that region of the first partial layer which is not covered by the etching stop layer, with the result that the first and second partial layers lie directly one above the other in the region left free by the etching stop layer;
a mask is applied to the second partial layer in the region which is not covered by the etching stop layer; and
using the mask, the second partial layer is removed from the etching stop layer by means of an etching process, with the result that the second partial layer remains in the region covered by the mask on the first partial layer and both partial layers there together form the material-reinforced semiconductor layer.

In accordance with this embodiment, use is made of an etching stop layer applied to the first partial layer in one of the two regions. The second partial layer is applied to the etching stop layer and that region of the first partial layer which is not covered by the etching stop layer. An applied mask covers the second partial layer in the region not covered by the etching stop layer. The applied mask and the etching stop layer thus cover largely complementary regions with respect to one another.

During the subsequent etching of the second partial layer, the latter is removed from the etching stop layer. The etching stop layer serves to protect the first partial layer. The thickness of the first partial layer, which constitutes the semiconductor layer in the cell region, depends inter alia on whether the doping in the cell region is effected by means of implantation or by means of an additionally applied doped semiconductor layer. The first partial layer should be made thinner in the first case than in the last case.

The present invention also specifies a semiconductor product which is provided with FE transistors that are adapted comparatively well to the purpose of use and which has a semiconductor substrate with at least one memory region and at least one logic region,
in the memory region and in the logic region, gate electrodes made of a semiconductor material being seated on a dielectric layer serving as gate dielectric,
the dielectric layer having the same thickness both in the logic region and in the memory region, and
one portion of the gate electrodes in the logic region being p-doped and the other portion of the gate electrodes in the logic region being n-doped.

A semiconductor product of this type is disclosed, for example, in U.S. Pat. No. 6,107,154. The present invention achieves the semiconductor product mentioned above by virtue of the fact that the semiconductor material of the gate electrodes in the logic region or in the memory region has a greater material thickness than in the respective other region.

The different material thickness of the semiconductor material of the gate electrodes in the logic and memory regions allows greater freedom with regard to the adaptation of the transistor properties to the respective purpose of use. Preferably, the semiconductor material of the gate electrodes in the logic region has a greater material thickness than the semiconductor material of the gate electrodes in the memory region. The semiconductor product is preferably an embedded DRAM.

In principle, the resistance of the gate lines is reduced through a larger material thickness. In the cell region, a particularly high conductivity is required in order to be able to form gate lines that are as long as possible. Therefore, a tungsten silicide layer ($WSi_x$), a tungsten layer (W) or a similar metallic layer is applied there to the semiconductor material of the gate electrodes. In the logic region, by contrast, such an additional layer is a hindrance since it restricts the possibility of different gate dopings. In order to enable a sufficiently low resistance of the gate lines in the memory region as well, a larger material thickness of the semiconductor layer is therefore sought there.

Furthermore, the semiconductor product according to the invention is distinguished by the fact that an interspace that is spaced apart from the gate electrodes in the logic and memory regions and is filled with an insulating material is arranged in between the logic region and the memory region. In this case, the filled interspace may be surrounded by further insulating layers, e.g. silicon nitride layers, and thus be separated from planarizing insulation materials.

BRIEF DESCRIPTION OF THE DRAWINGS

The invention is explained below using exemplary embodiments and is illustrated in the figures, in which:

FIGS. 2 to 28 show a sequence illustrated in greater detail by comparison.

DETAILED DESCRIPTION OF THE INVENTION

Figure 1A:
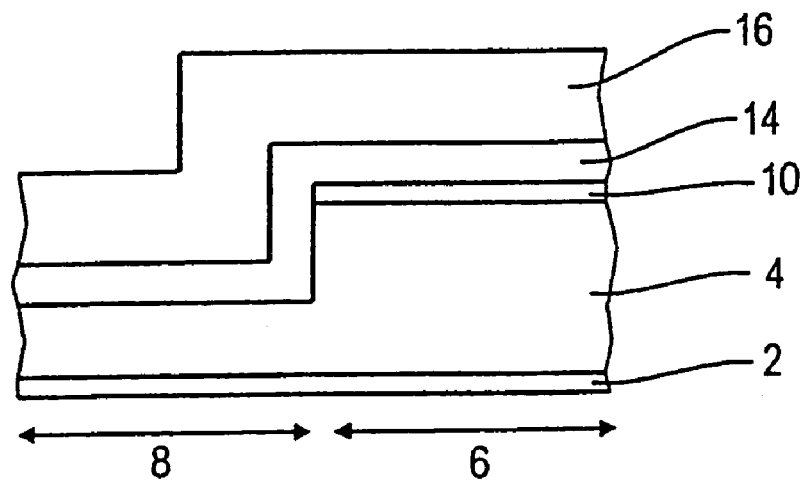
FIGS. 1A to 1C show the diagrammatic sequence of the method according to the invention.
Figure 1B:
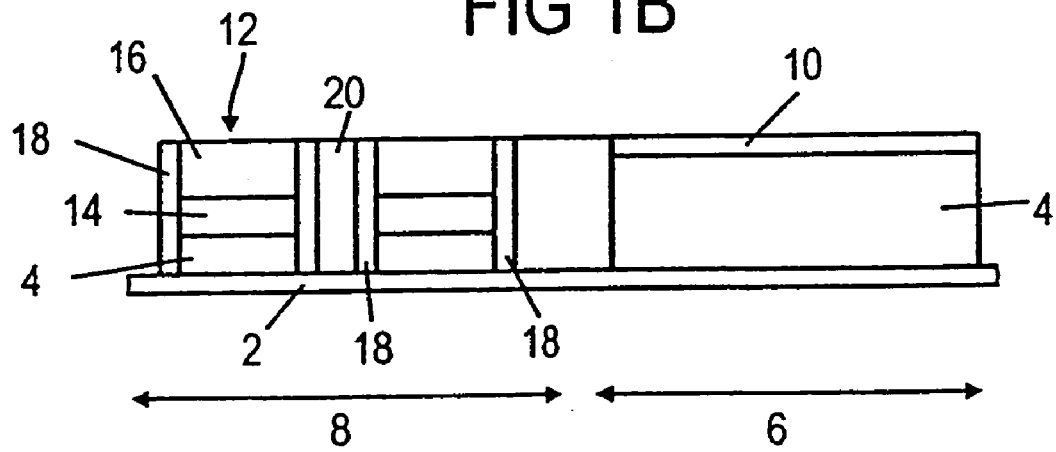
Figure 1C:
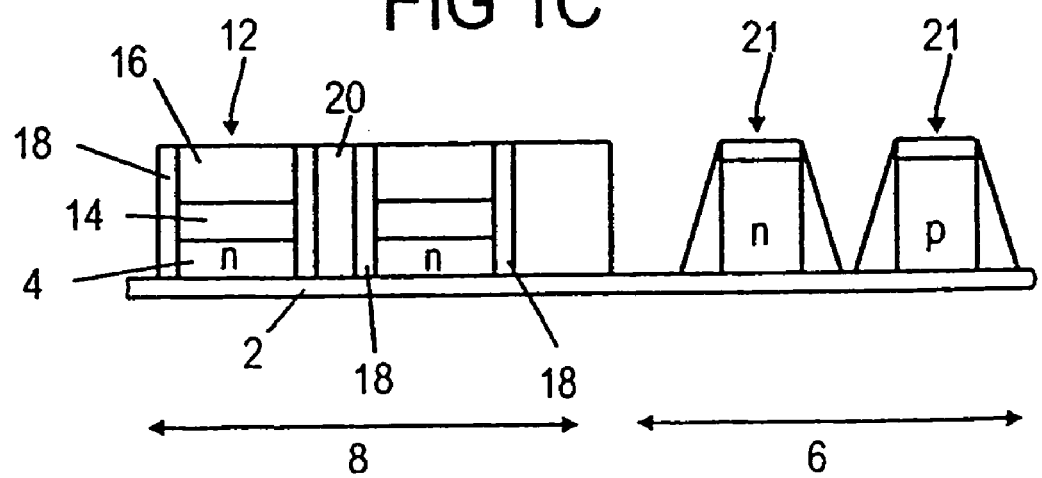

FIGS. 1A to 1C show the basic sequence of the method according to the invention. Firstly, a dielectric layer 2 and a semiconductor layer 4 are formed. The semiconductor layer 4 is made thicker in the logic region 6, lying in the right-hand half of the figure in FIG. 1A, than in the memory region 8, lying in the left-hand half of the figure. 10 designates an insulating layer which covers the semiconductor layer 4 in the logic region 6. Before the formation of the gate electrodes 12 in the memory region 8, a metal-including layer 14 and a covering insulation layer 16 are deposited over the whole area. The formation of the dielectric layer 2 is typically preceded by the formation of the wells for the transistors to be formed, in particular in the logic region 6, by implantation.

As can be seen from FIG. 1B, the gate electrodes 12 in the memory region 8 are fabricated, which are laterally covered by insulating edge webs 18. Before the filling of the interspaces between the gate electrodes 12 with an insulation material 20, which terminates with the upper edge of the gate electrodes 12, source and drain regions (not illustrated in FIG. 1B) are implanted. Thus, the transistors are completed, in principle, in the memory region 8. In the logic region 6, by contrast, the semiconductor layer 4 is still unpatterned. Subsequently, the gate electrodes 21 are patterned and p- or n-doped and the source and drain regions are formed in order to complete the transistors. The structure thus obtained is illustrated in FIG. 1C.

The advantage of this sequence resides, in particular, in the fact that the formation of the insulating edge webs 18 and the filling of the interspaces between the gate electrodes 12 are effected with no influencing of the semiconductor layer 4 in the logic region 6 and, in particular, of the transistors to be formed there, since the latter, apart from well implantations, have not yet been formed at this point in time. The insulating layer 10 serves to protect the semiconductor layer 4 in the logic region. A further advantage that can be mentioned is the largely mutually independent fabrication of the transistors in the memory and logic regions, which allows targeted adaptation of the transistor properties to the respective purpose of use. The transistors in the logic region are formed as dual work function devices.

It is favorable, moreover, that an inherently optimized logic process section following the patterning of the memory region can be incorporated or adopted in quasi modular fashion for the formation of the transistors in the logic region 6. The thermal steps during a logic process are generally lower than in the memory process, with the result that the influencing of the already patterned memory region 8 is noncritical. In the prior art, by contrast, the process steps for fabricating logic and memory regions overlap, cutbacks inevitably having to be accepted in the optimization.

The method will be described in more detail below with reference to FIGS. 2 to 28. In this case, the same reference symbols applied in FIGS. 1A to 1C are used for identical structures. The layer thicknesses mentioned here are by way of example.

On a semiconductor substrate 22, after the formation of the wells for the transistors (not shown here), a dielectric layer 2 is formed preferably by thermal oxidation of the semiconductor substrate 22 composed of monocrystalline silicon. The dielectric layer 2 serves as gate dielectric both in the memory region 8 and in the logic region 6. A first partial layer 26 made of undoped polysilicon is deposited onto the dielectric layer 2 by means of a CVD (chemical vapor deposition) method. The thickness of the first partial layer 26 is about 40 nm. In the case of a later doping of the first partial layer 26 by means of implantation, the thickness may be about 80 nm. An etching stop layer 28 made of silicon oxide that is subsequently applied by means of a CVD method covers the first partial layer 26 over the whole area. This is followed by the application of a photomask 30. The latter is formed by deposition and patterning of a photoresist layer, a medium-resolution lithography being required since the patterning of the etching stop layer 28 that is effected by means of anisotropic etching 32 is relatively noncritical. The patterned etching stop layer 28 can be seen in FIG. 3. The removal of the photomask 30 is followed by a cleaning of the uncovered regions of the first partial layer 26 by means of HF in order to completely remove oxide residues. The etching stop layer 28 can likewise be concomitantly attacked during the cleaning. However, since it is significantly thicker than the natural oxide layer or oxide residues present on the first partial layer 26, the etching stop layer remains with a sufficient thickness after the cleaning. A second partial layer 34 made of undoped polysilicon and having a thickness of about 80 nm is deposited onto the partial layer 26 thus cleaned. In this case, the two partial layers 26 and 34 are in direct contact in the logic region 6, whereas in the memory region 8 the two partial layers are separated from one another by the etching stop layer 28. In the logic region 6, the two partial layers 26 and 34 form the semiconductor layer 4, while in the memory region 8 the semiconductor layer 4 is formed by the first partial layer 26.

The semiconductor layer 4 thus has a greater material thickness in the logic region 6 than in the memory region 8.

In accordance with FIG. 4, an insulating layer 10 made of CVD silicon nitride is deposited and, in the logic region 6, is covered with a likewise photolithographically noncritical photomask 36. The insulating layer 10 is removed from the memory region 8 by a further anisotropic etching 38. The insulating layer 10 thus patterned subsequently serves as a mask during the patterning of the two partial layers by means of anisotropic etching 38. In this case, the anisotropic etching 38 is effected selectively with respect to the material of the etching stop layer 28 and with respect to the material of the insulating layer 10.

The insulation layer 16 (FIG. 7) should be made significantly thicker than the insulating layer 10, since both layers are etched in later method steps (FIG. 22), the insulation layer 16 not being intended to be completely removed. Suitable sizes are 200 nm for the insulation layer 16 and 50 nm for the insulating layer 10.

For the doping of the first partial layer 26, a polysilicon layer 42 doped with phosphorus is applied, as can be seen from FIG. 6. Said polysilicon layer covers the first partial layer 26 only in the memory region 8, whereas in the logic region 6 the insulating layer 10 lies between the semiconductor layer 4, formed from the two partial layers 26 and 34, and the doped polysilicon layer 42. This prevents diffusion of phosphorus into the semiconductor layer 4 of the logic region 6. The polysilicon layer 42, having a thickness of about 40 nm and a doping of about $10^{20}./cm^3$, remains on the first partial layer 26 in the memory region 8, so that there both together form the semiconductor layer 4. Together, the thickness of the semiconductor layer 4 is about 80 nm in the memory region 8, and by contrast 120 nm in the logic region 6.

Figure 7:
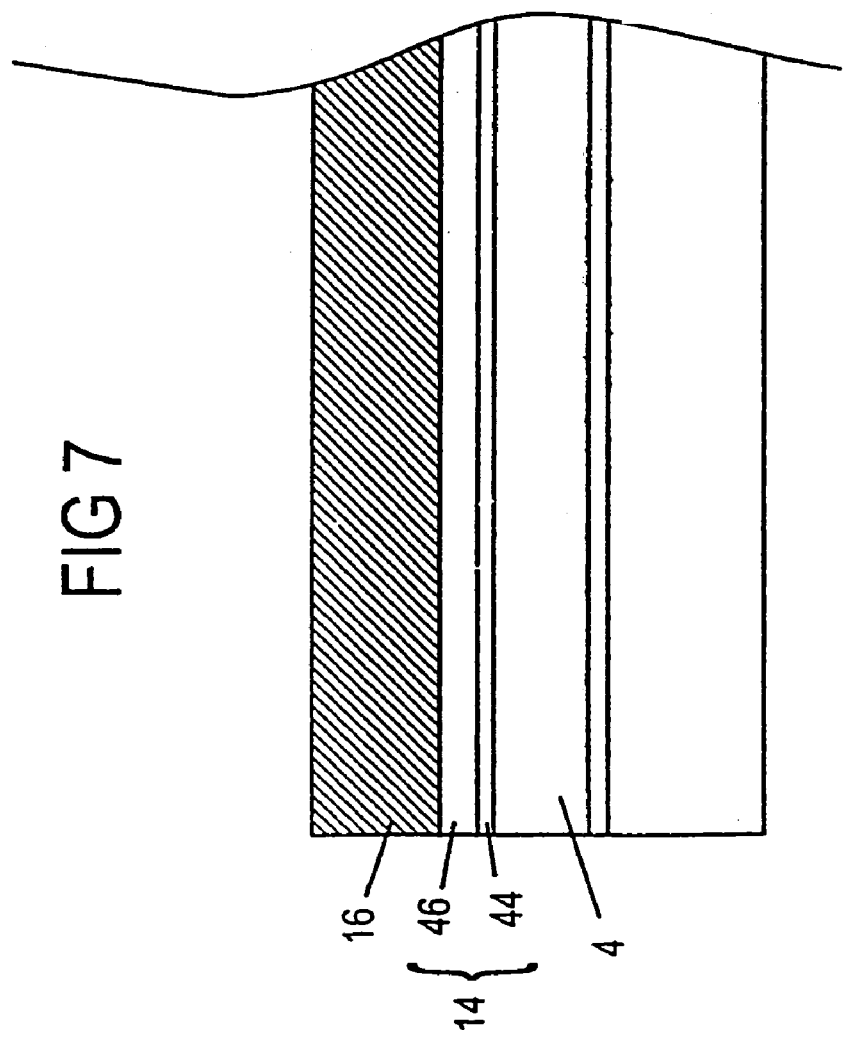
Figure 11:
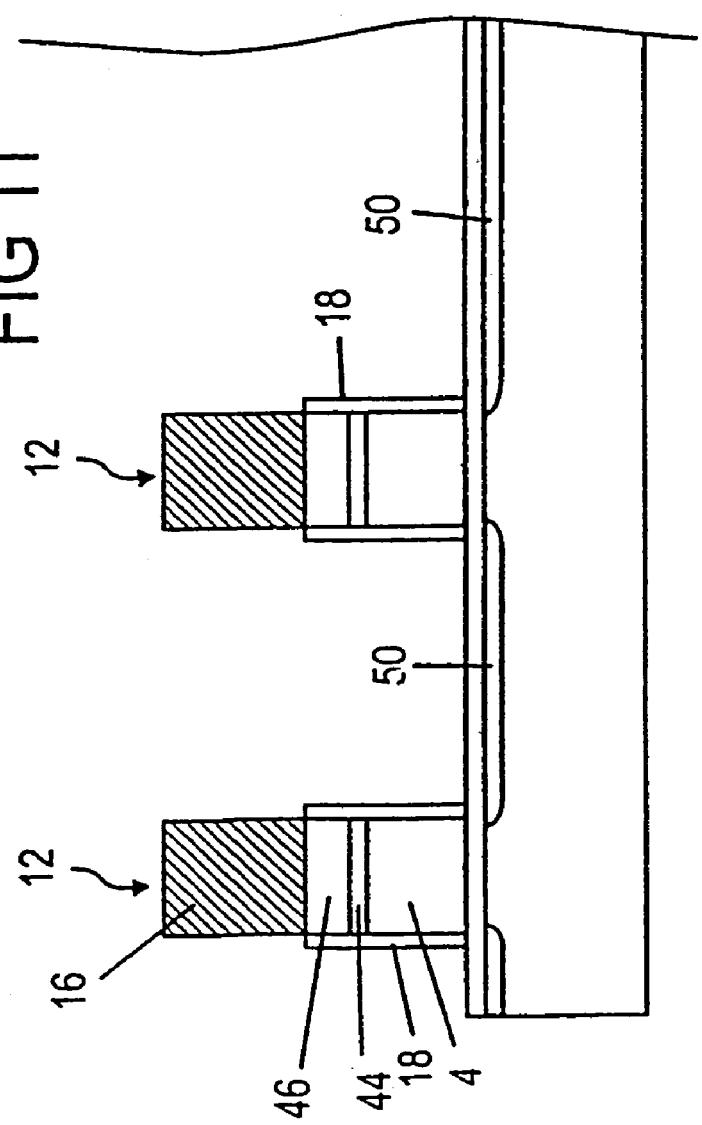

The metal-containing layer 14 and the insulation layer 16 are subsequently deposited, in accordance with FIG. 7. In this case, the metal-containing layer 14 preferably comprises a tungsten nitride layer 44 and a tungsten layer 46. The insulation layer 16 constitutes the so-called cap nitride and is deposited by means of a CVD method.

In further method steps, the gate electrodes 12 in the memory region 8 are patterned. To that end, a photomask 48 fabricated by a high-resolution lithography is formed in the memory region 8 and firstly the insulation layer 16 is etched. The latter remains in the regions covered by the photomask 48 and can therefore subsequently be used as a hard mask. The anisotropic etching of the tungsten layer 46, of the tungsten nitride layer 44 and of the semiconductor layer 4 is effected selectively with respect to the material of the insulation layer 16 (silicon nitride in this case). This results in gate electrodes 12 with the layered construction comprising n-doped polysilicon, tungsten nitride and tungsten with emplaced cap nitride. The insulating layer 10, likewise composed of silicon nitride, protects the semiconductor layer 4 in the logic region 6 during the etching. The situation after the etching is shown in FIG. 9. Insulating edge webs 18 are subsequently formed by oxidation of the sidewalls of the gate electrodes 12.

Afterward, dopants for the formation of LDD regions are introduced into the uncovered semiconductor substrate 22 in the memory region 8, by means of inclined or vertical implantation. The semiconductor layer 4 in the logic region 6 is additionally protected with a photomask 52. Next, a thin LP-CVD (low pressure chemical vapor deposition) nitride layer 54 is deposited conformly and etched back anisotropically, with the result that edge webs 54 remain on the sidewalls of the gate electrodes 12. The source and drain regions 56 of the transistors in the memory region 8 are produced by means of a further implantation of dopants into the uncovered semiconductor substrate 22 in the memory region 8 and a subsequent annealing step for activating the dopants and for annealing implantation damage (FIG. 12).

Figure 14:
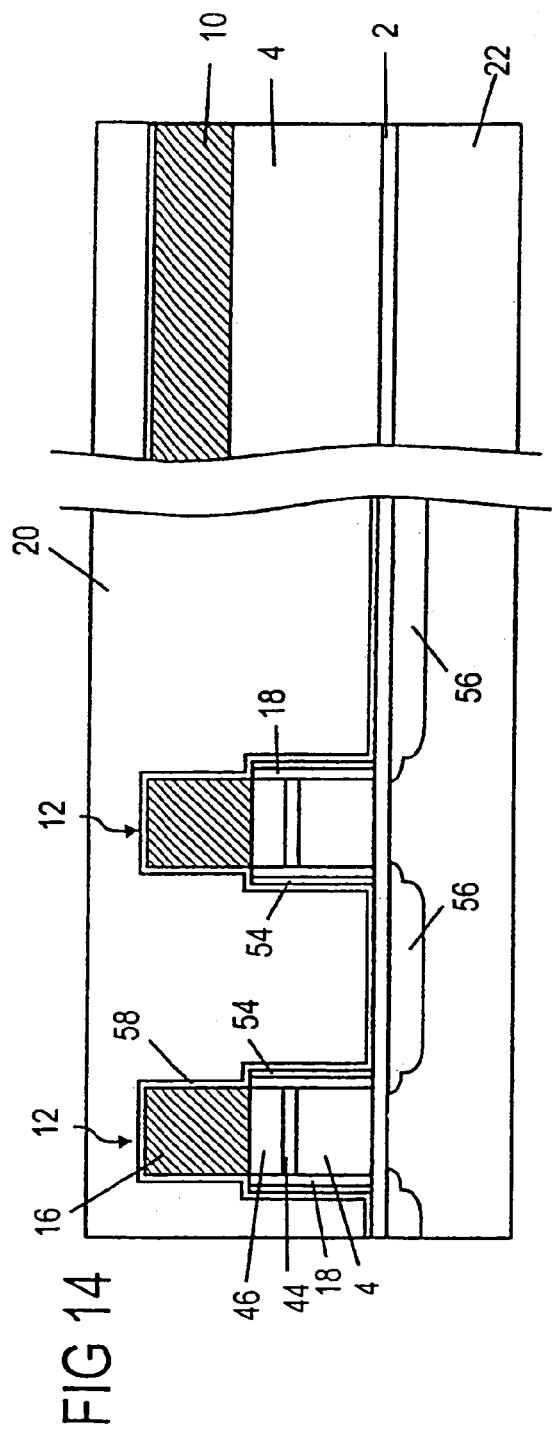
Figure 15:
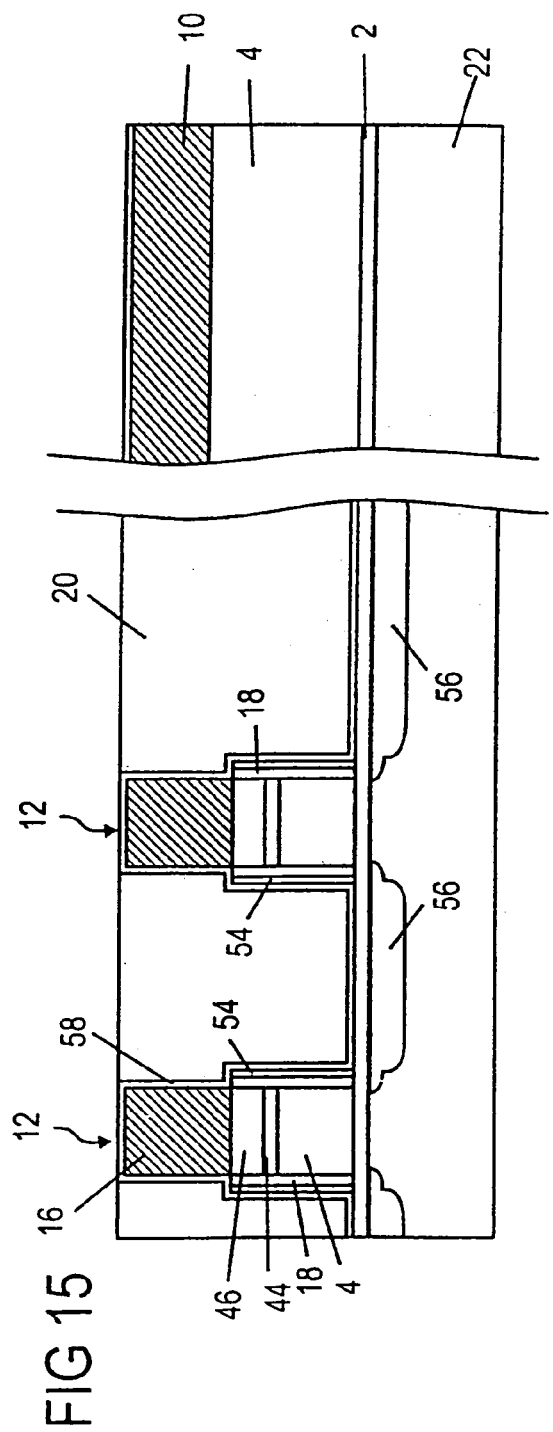
Figure 16:
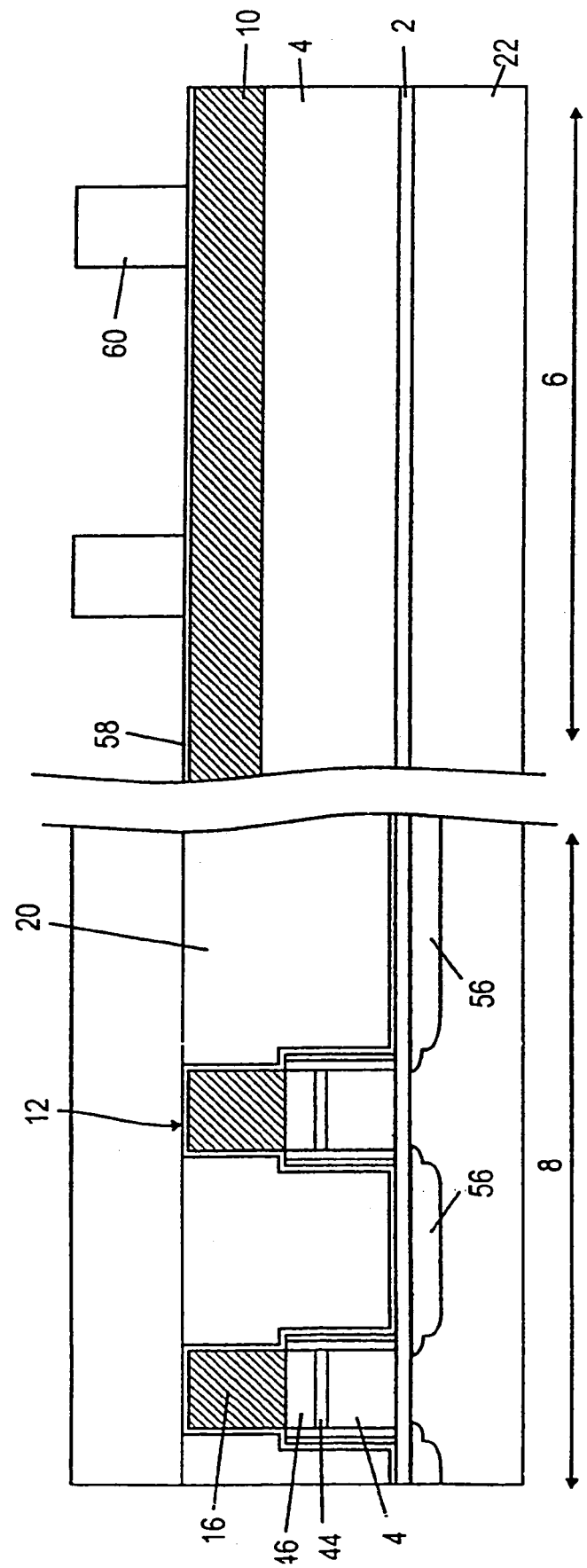

Afterward, a further thin nitride layer 58 is deposited, the interspaces between the gate electrodes are filled with an insulation material 20 made of BPSG (P- and B-doped silicon glass), the BPSG is densified at 800° C. and subsequently planarized with a stop on the nitride layers 16 and 58. These steps are illustrated in FIGS. 13 to 15. This concludes the process performance in the memory region for the time being.

During the individual etching steps in the memory region 8, it can happen that the gate oxide 2 between the gate electrodes 12 is also attacked or partly removed. This is possible, e.g. during the etching of the gate stack (gate electrodes). A partial removal is noncritical, however, since contacts to the doping regions 56 are usually produced at these locations in later method steps.

The transistors in the logic region are then formed. To that end, a photomask 60 patterned by high-resolution lithography is applied. A photoresist which is optimized for the formation of the transistors in the logic region is used as material for the photomask 60. By way of example, a negative photoresist may be involved in this case. Using the photomask 60, the nitride layer 58 and the insulating layer 10 (silicon nitride) are patterned, with the result that the etched nitride layers can be used as a hard mask. In this case, the insulation layer 16—composed of silicon nitride—in the memory region 8 is protected by the photomask 60. Afterward, the photomask 60 is removed, the semiconductor layer 4 is patterned by an oxide—and nitride-sparing polysilicon etching and a cleaning is carried out using HF. In this case, it is essential not to remove the gate oxide 2 between the gate electrodes 21, since otherwise so-called silicon pitting of the semiconductor substrate 22 can occur.

Figure 17:
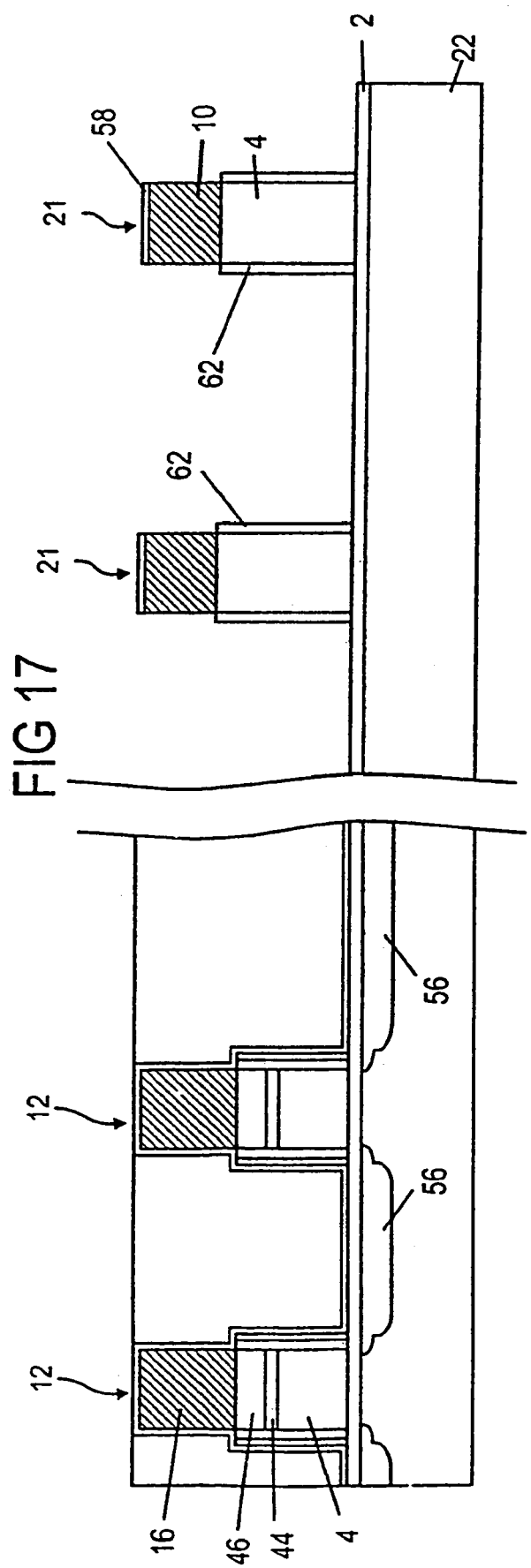
Figure 18:
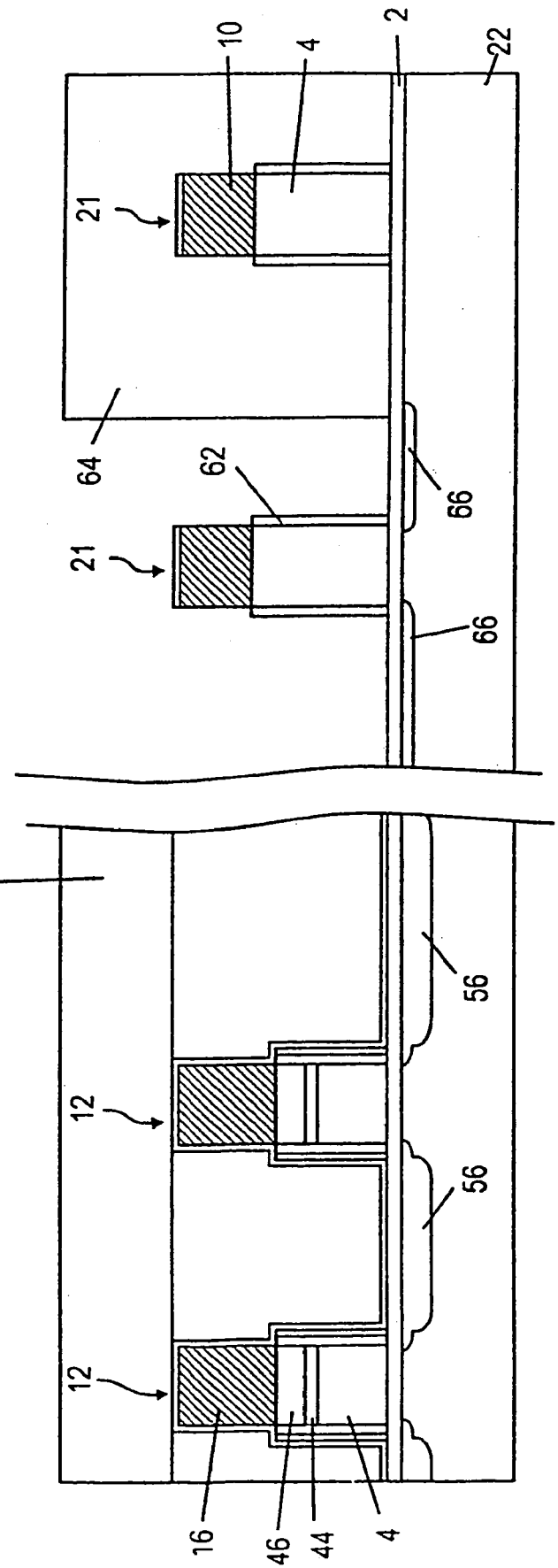
Figure 19:
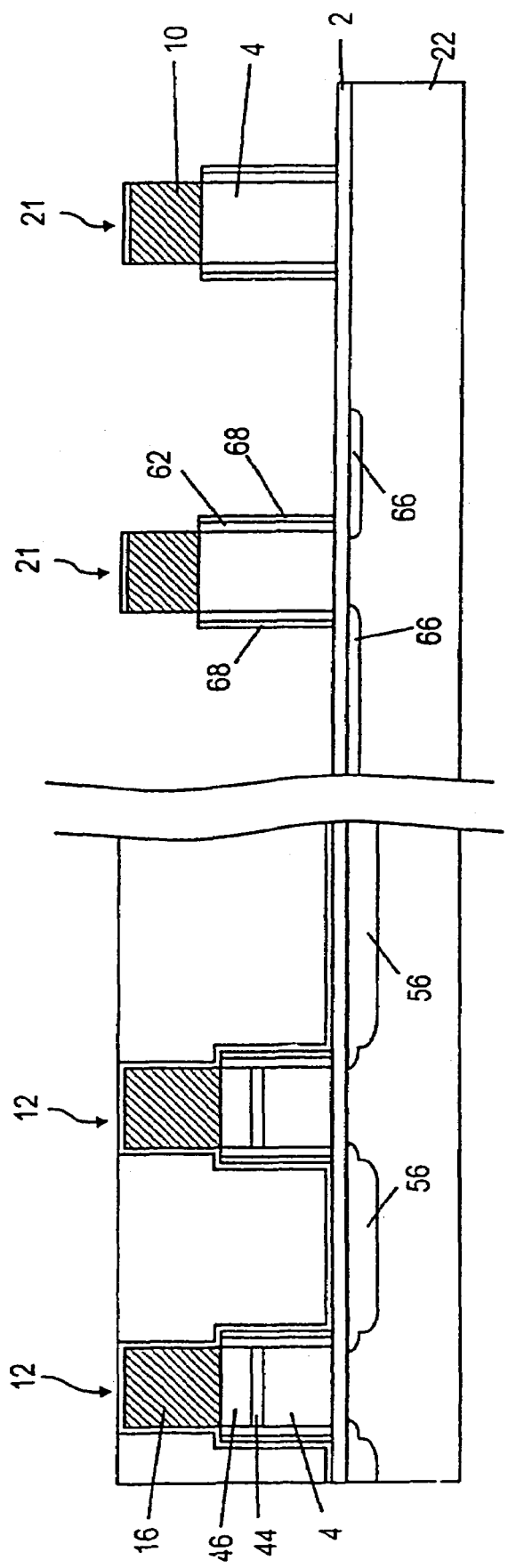

Afterward, the sidewalls of the gate electrodes 21 thus produced are oxidized and insulating edge webs 62 are formed in the process, as can be gathered from FIG. 17. During the oxidation, further oxide can arise on the semiconductor substrate 22 between the gate electrodes 21.

Using a further photomask 64, n-doped LDD regions 66 for the n-channel transistors are introduced into the semiconductor substrate 22 by means of implantation. After the removal of the photomask 64, a thin LP-CVD nitride is deposited and etched back anisotropically to leave edge webs 68 made of nitride on the sidewalls of the gate electrodes 21. As can be seen from FIG. 20, using a further photomask 70, the n-channel transistors in the logic region and also the entire memory region are covered and p-doped LDD regions 72 for the p-channel transistors are implanted in the semiconductor substrate 22.

Figure 21:
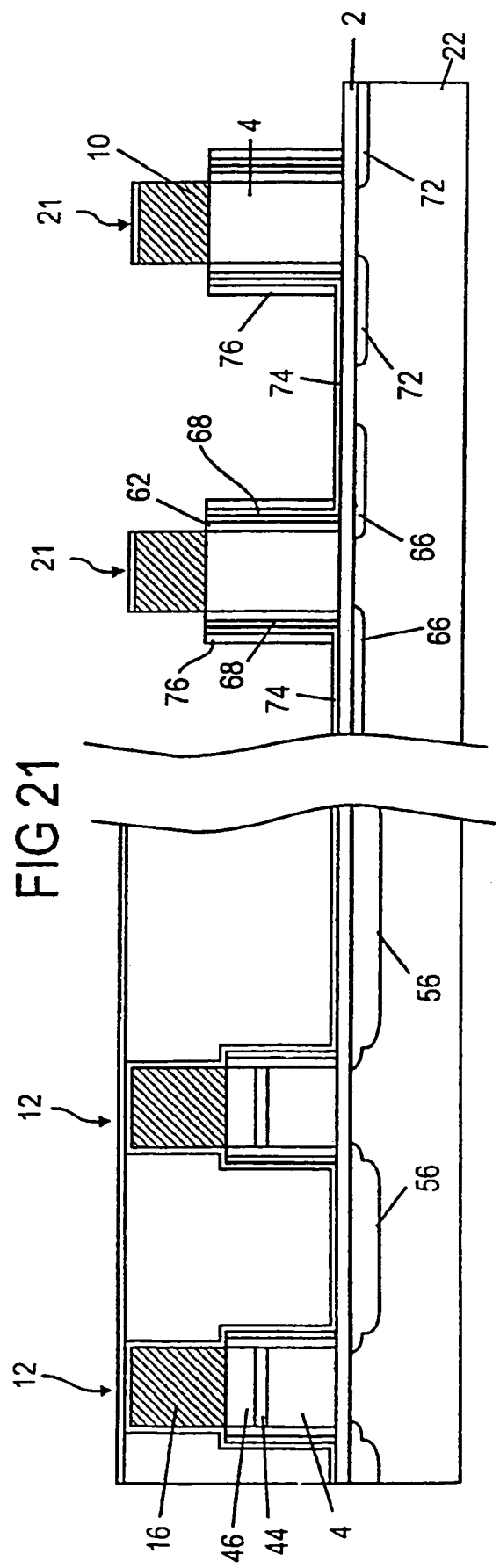
Figure 22:
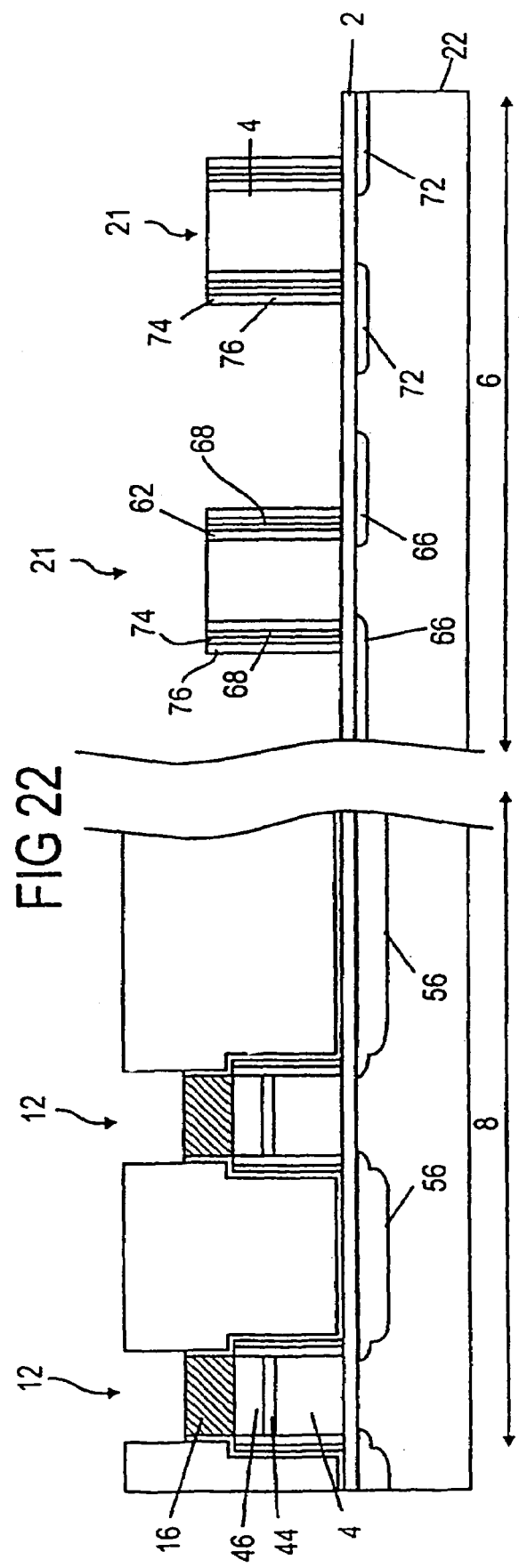

There follow, in accordance with FIGS. 21 and 22, the deposition of a further nitride layer 74 and a CVD ozone SWS oxide layer 76 (SWS=sidewall spacer) to a thickness of about 60 nm and the anisotropic etching-back of the SWS oxide layer 76 and the nitride layer 74 to leave edge webs 74 and 76 on the sides of the gate electrodes 21. During a subsequent nitride etching, the cap nitride 10 (insulating layer) is removed from the gate electrodes 21 in the logic region 6. In this case, the insulation layer 16 situated on the gate electrodes 12 in the memory region is partly etched back on account of its significantly higher material thickness.

Figure 23:
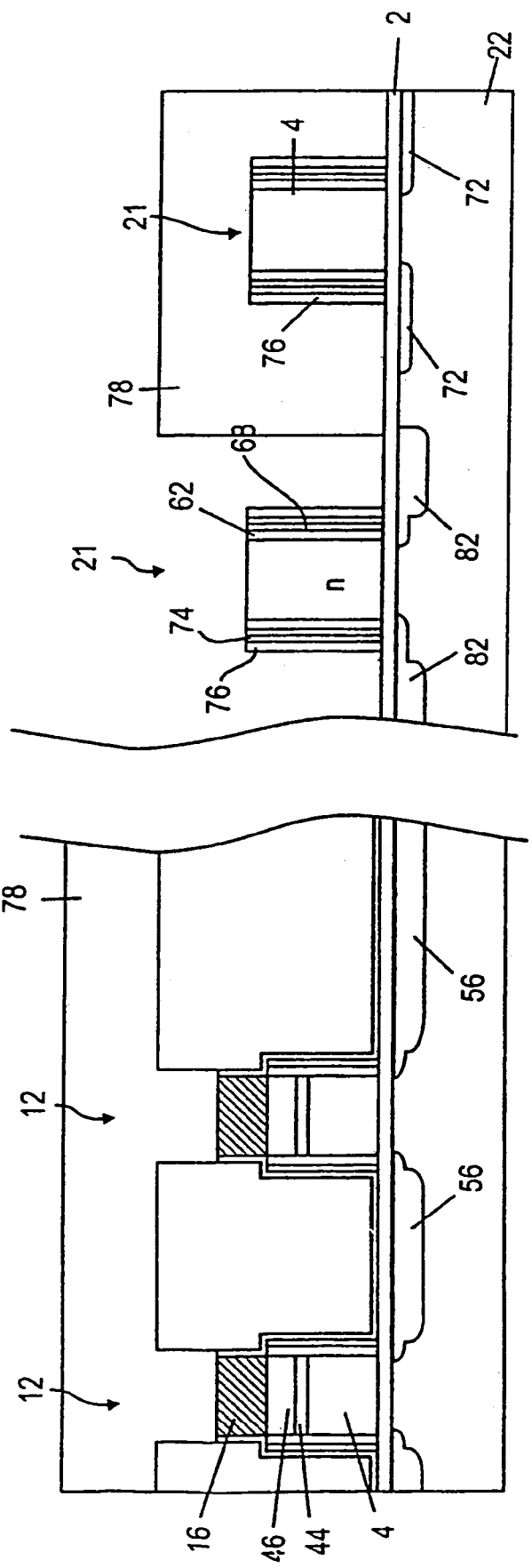
Figure 24:
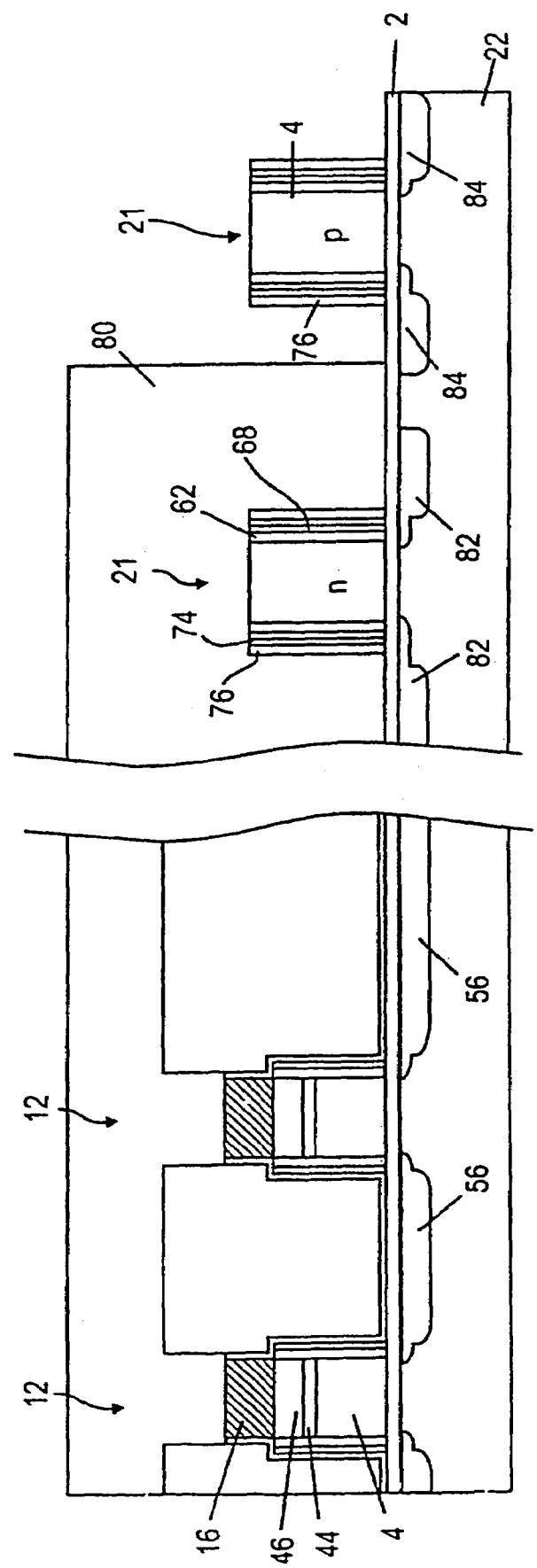
Figure 25:
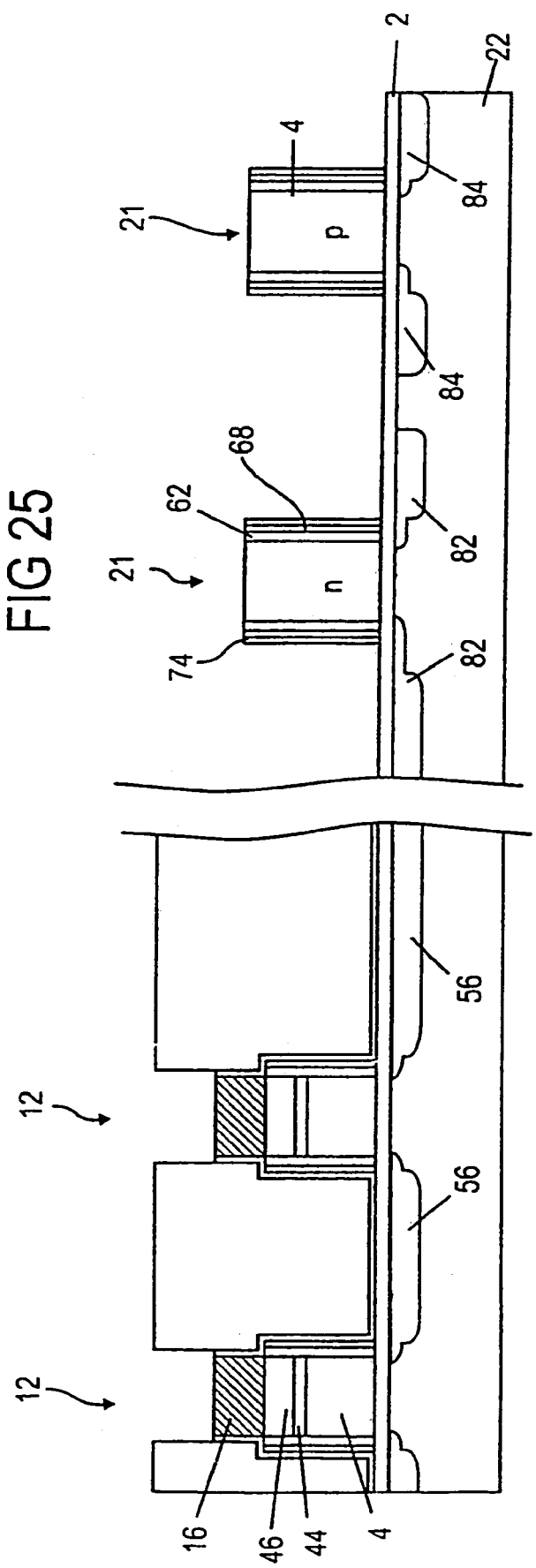
Figure 28:
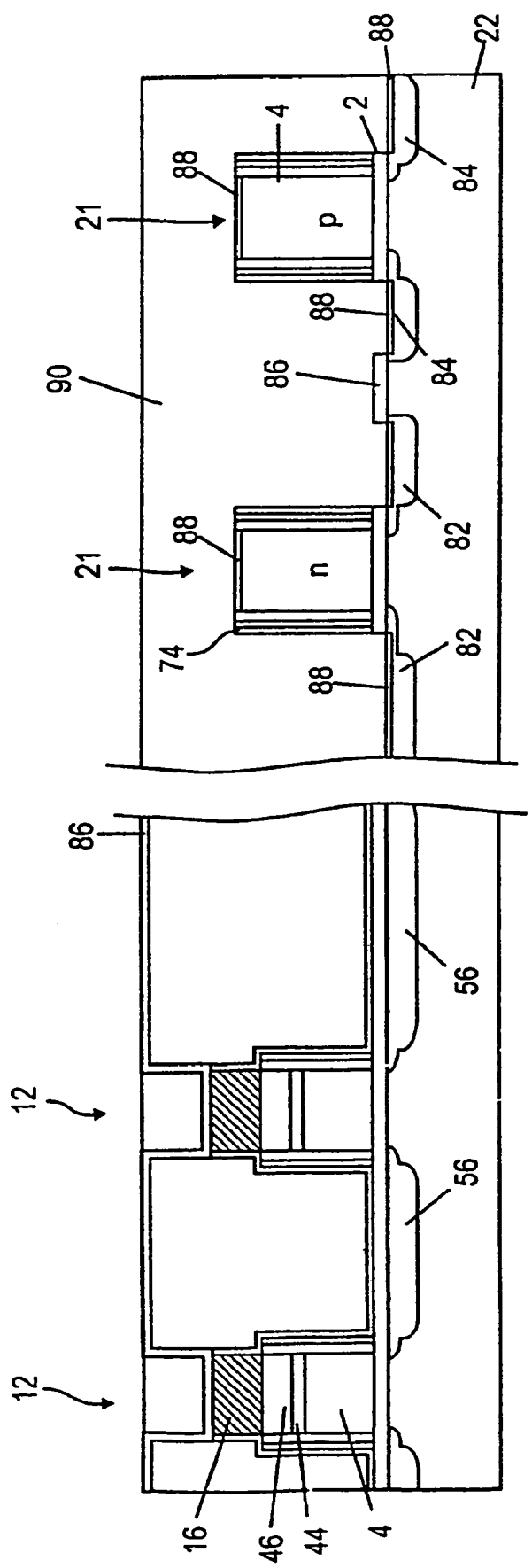

Using further photomasks 78 and 80, in accordance with FIGS. 23 and 24, the source and drain regions 82 and 84 and also the p- and n-doped gate electrodes 21 of the n-channel transistors and p-channel transistors are implanted. The implantation is followed by an annealing step.

In the next method step, a silicon nitride layer 86 and a masking layer (not illustrated here) for a subsequent siliconization are applied. The masking layer serves as a mask for the etching of the nitride layer 86, which is removed where the semiconductor substrate 22 and the semiconductor layer 4 are intended to be siliconized. By means of sputtering, after wet-chemical cleaning using HF in order to remove residual oxide, on the uncovered silicon surfaces, a cobalt layer or titanium layer is applied and converted during a thermal treatment whilst reacting with the uncovered silicon to form cobalt silicide 88 or titanium silicide. Unconverted cobalt or titanium is removed.

Finally, a BPSG layer 90 is deposited, thermally densified with a lower thermal budget (lower temperature) than in the cell region and planarized.

LIST OF REFERENCE SYMBOLS

2 Dielectric layer/gate dielectric
4 Semiconductor layer
6 Logic region
8 Memory region
10 Insulating layer
12 Gate electrodes in the memory region
14 Metal-containing layer
16 Insulation layer
18 Insulating edge webs
20 Insulation material
21 Gate electrodes in the logic region
22 Semiconductor substrate
26 First partial layer
28 Etching stop layer
30 Photomask
32 Anisotropic etching
34 Second partial layer
36 Photomask
38 Anisotropic etching
42 Doped polysilicon layer
44 Tungsten nitride layer
46 Tungsten layer
48 Photomask
50 LDD region
52 Photomask
54 Nitride layer/edge webs
56 Source and drain regions
58 Nitride layer
60 Photomask
62 Insulating edge webs
64 Photomask
66 LDD regions of the n-channel transistors
68 Nitride layer/edge webs
70 Photomask
72 LDD regions of the p-channel transistors
74 Nitride layer/edge webs
76 SWS oxide layer/edge webs
78 Photomask
80 Photomask
82 Source and drain regions of the n-channel transistors
84 Source and drain regions of the p-channel transistors
86 Silicon nitride layer
88 Cobalt silicide layer
90 BPSG layer

What is claimed is:

1. A method for fabricating a semiconductor product which has a semiconductor substrate with at least one memory region and a logic region, comprising:
    applying a dielectric layer serving as gate dielectric and a semiconductor layer to a surface of the semiconductor substrate in the memory region and in the logic region, the semiconductor layer comprises a first and a second partial layer, which covers the first partial layer either in the logic region or in the memory region, resulting in the semiconductor layer being reinforced in one of the two regions by application of the second partial layer to the first partial layer;
    patterning the semiconductor layer in the memory region with the formation of gate electrodes;
    introducing dopants for forming source and drain regions, in the memory region, adjacent to the gate electrodes formed there, into the semiconductor substrate;
    substantially filling the interspaces between the gate electrodes in the memory region with an insulation material; and
    patterning, in the logic region, the semiconductor layer with the formation of gate electrodes and the gate electrodes formed therein are doped, one portion of these gate electrodes being n-doped and the other portion being p-doped.

2. The method as claimed in claim 1, wherein insulating edge webs are formed at sidewalls of the gate electrodes in the memory region by thermal oxidation of the sidewalls of the gate electrodes.

3. The method as claimed in claim 1, wherein before the formation of the gate electrodes in the memory region, the semiconductor layer is doped in the memory region.

4. The method as claimed in claim 3, wherein a doped semiconductor layer is applied for the doping of the semiconductor layer in the memory region.

5. The method as claimed in claim 1, wherein before the formation of the gate electrodes in the memory region, an insulating layer is applied to the semiconductor layer in the logic region.

6. The method as claimed in claim 1, wherein
    to form the semiconductor layer comprising two partial layers,
    an etching stop layer is applied to the first partial layer deposited over a whole area, which etching stop layer covers the first partial layer in the logic region or in the memory region;
    further semiconductor material for the formation of the second partial layer is applied over a whole area of the etching stop layer and a region of the first partial layer which is not covered by the etching stop layer, resulting in the first and second partial layers lying directly one above the other in the region left free by the etching stop layer;
    a mask is applied to the second partial layer in the region which is not covered by the etching stop layer; and
    using the mask, the second partial layer is removed from the etching stop layer by means of an etching process, resulting in the second partial layer remaining in the region covered by the mask on the first partial layer and partial layers together form the material-reinforced semiconductor layer.

7. The method as claimed in claim 6, wherein the etching stop layer is removed after the etching of the second partial layer.

8. The method as claimed in claim 6, wherein the insulating layer is applied to the second partial layer and etched together with the second partial layer, resulting in the insulating layer remaining on the second partial layer.

9. The method as claimed in claim 5, wherein the insulating layer is composed of silicon nitride.

10. The method as claimed in claim 1, wherein the second partial layer covers the first partial layer in the logic region.

11. The method as claimed in claim 1, wherein at least one conductive metal-containing layer and an insulation layer are applied to the semiconductor layer in the memory region and patterned together with the semiconductor layer with the formation of the gate electrodes.

12. The method as claimed in claim 11, wherein the at least one conductive metal-containing layer comprises a tungsten nitride and a tungsten layer, and the insulation layer is composed of silicon nitride.

13. The method as claimed in claim 1, wherein after the formation of the gate electrodes in the logic region, source and drain regions are produced laterally with respect to the gate electrodes.

14. A semiconductor product which has a semiconductor substrate with at least one memory region and at least one logic region, comprising:

gate electrodes made of a semiconductor material being seated on a dielectric layer serving as gate dielectric, in the memory region and in the logic region;

the dielectric layer having a same thickness in the logic region and in the memory region; and one portion of the gate electrodes in the logic region being p-doped and the other portion of the gate electrodes in the logic region being n-doped, wherein the semiconductor material of the gate electrodes in the logic region or in the memory region has a greater material thickness than in the respective other region.

15. The semiconductor product as claimed in claim 14, wherein the semiconductor material of the gate electrodes in the logic region has a greater material thickness than the semiconductor material of the gate electrodes in the memory region.

16. The semiconductor product as claimed in claim 15, wherein the semiconductor product is an embedded DRAM.

* * * * *